United States Patent [19]

Gergis

[11] 4,360,904
[45] Nov. 23, 1982

[54] SEGMENTED STRETCHER DETECTOR FOR MAGNETIC BUBBLE DOMAIN DEVICES

[75] Inventor: Isoris S. Gergis, Yorba Linda, Calif.

[73] Assignee: Rockwell International Corporation, El Segundo, Calif.

[21] Appl. No.: 200,815

[22] Filed: Oct. 27, 1980

[51] Int. Cl.³ ............................................. G11C 19/08
[52] U.S. Cl. ......................................... 365/12; 365/8; 365/16; 365/36
[58] Field of Search ...................... 365/7, 8, 9, 12, 13, 365/15, 16, 36

[56] References Cited

U.S. PATENT DOCUMENTS 4,078,230  3/1978  George .................................. 365/8

OTHER PUBLICATIONS

IEEE Transactions on Magnetics–vol. Mag.-12, No. 4, pp. 411–413, Jul. 1976.
Electronics–May 22, 1980, pp. 41–42.

Primary Examiner—James W. Moffitt
Attorney, Agent, or Firm—H. Fredrick Hamann; Daniel R. McGlynn

[57] ABSTRACT

A magnetic bubble domain device including a segmented stretcher detector. The detector is formed from a propagation path for magnetic bubble domains, and a first replicator disposed adjacent the propagation path. The first replicator functions to replicate one of the propagating bubble domains into a pair of magnetic bubble domains, and to transfer one of the bubble domains into a first secondary track extending in a direction different from the direction of the propagation path. A second replicator is disposed along the propagation path and functions to replicate the one bubble domain into a pair of magnetic bubble domains and to transfer one of the bubble domains into a second secondary track extending generally in the first direction. Finally, the detector is disposed along the first direction and functions to detect the plurality of magnetic bubble domains.

4 Claims, 6 Drawing Figures

SEGMENTED STRETCHER DETECTOR FOR MAGNETIC BUBBLE DOMAIN DEVICES

TECHNICAL FIELD OF THE INVENTION

The invention relates to magnetic bubble domain devices and in particular to bubble domain detectors for detecting the presence of bubbles in a propagation path.

BACKGROUND OF THE INVENTION

Magnetic bubble domain devices are well known in the art. There are two methods by which bubbles are propagated in bubble devices; one is the usual field access type and the second is the current (or conductor) access type. The most familiar mode of operating a magnetic bubble device is termed the "field-access" mode. In this mode, a pattern of magnetically soft elements (such as permalloy or ion-implanted contiguous disks) is formed in a plane adjacent a layer of material in which the bubbles are moved. A magnetic field is generated in the plane of the layer and the field caused to reorient to incrementally-offset radial positions cyclically in the plane. Each element is so shaped that various portions thereof respond to the in-plane field to generate pole-patterns which change as the field precesses. The configuration of adjacent elements sets up a sequence of travelling potential wells in the layer which causes bubble movement.

In current access devices, the necessary potential wells are provided by a set of conductor patterns in which polyphase, usually two or three phase, currents are transmitted. The conductors are typically formed in multiple layers, insulated from one another and driven in a two or three phase manner. An example of such a device is described in U.S. Pat. No. 3,460,116.

Various types of magnetic bubble domain device architectures are known in the prior art, including the major loop minor loop configuration. The major loop/minor loop configuration, such as described in U.S. Pat. No. 3,618,054, consists of a plurality of first recirculating "minor" channels and a second "major" channel.

Bubble detection normally involves the expansion of the bubble into a long stripe domain for the purpose of increasing the magnetic flux available for sensing to achieve adequate signal level. In field access permalloy devices, the expansion is accomplished by using a number of chevron stacks which act both to propagate and simultaneously expand the bubble perpendicular to the propagation direction. It is thus possible to obtain very long stripe domains by gradual expansion over a number of field cycles in as many chevron stacks. The cost is paid only in large detector areas.

In current access devices, the bubble expansion is performed in a current driven conductor expander usually in the form of a single conductor loop (such as in U.S. Pat. No. 3,564,518), or a dual conductor gradual expander configuration. In both configurations, large currents are applied for the period required to expand the bubble. The result is that only small expansion lengths can be achieved (practically around 100 $\mu$m in 8 $\mu$m period devices operating at 100 kHz). The reason is that the power dissipation increases as the square of the expansion length. Furthermore, the prior art configurations do not allow for consecutive bit detection if the expansion time is longer than the stepping rate of the circuit (inverse of the frequency of operation).

In ion-implanted contiguous disk devices, the bubble detection is performed in current-assisted stretcher detector which is composed of a hair-pin conductor loop and a thin permalloy bar located along the loop. A bubble propagating in the ion-implanted track is stretched as it arrives at a predetermined location inside the loop by applying a sufficiently large current in the conductor loop to reduce the local bias field to below the bubble strip out field. Due to the finite mobility of the domain wall motion, the stretching of the bubble requires a fairly large fraction of the field cycle. In devices reported by T. J. Nelson and R. Wolf, in a paper entitled "Design of Bubble Device Element Employing Ion-Implanted Propagation Patterns", presented orally at the Intermag Conference in Boston, Mass. in May 1980, a stretcher 100 $\mu$m long requiring 2.5 $\mu$sec. stretch pulse with 70 to 100 ma pulse amplitude was described. The sense signal was about 1 to 2 m volts. To obtain larger signals or to operate at higher frequency, the pulse width to period ratio must be increased to allow for longer stretch time. This leads to larger power dissipation in the detector which might then exceed its power handling capacity resulting in device failure.

Prior to the present invention, there has not been a stretcher detector capable of operating at high frequency with low power dissipation.

SUMMARY OF THE INVENTION

Briefly and in general terms, the present invention provides a detector for magnetic bubble domain devices including a first propagation path for magnetic bubble domains; and a plurality of replication devices disposed adjacent the propagation path, each functioning to replicate the bubble domain into pairs of magnetic bubble domains and to transfer one of the bubble domains in a first direction different from the direction of the propagation path.

A detection device functions to detect the plurality of magnetic bubble domains so created.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

BRIEF DESCRIPTION OF THE DRAWING

FIG. 3b is a timing diagram of the magnetic drive field and switching current without replication applied to the configuration shown in FIG. 3a;

FIG. 3c is a timing diagram of the magnetic drive field and switching current with replication applied to the configuration shown in FIG. 3a.

DESCRIPTION OF THE PREFERRED EMBODIMENT

Figure 1:
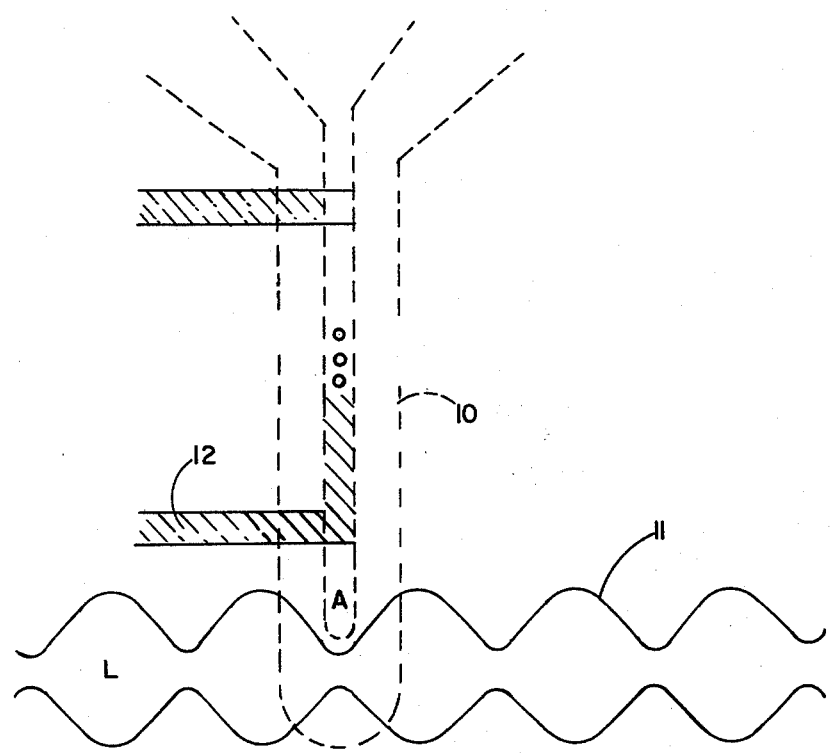
FIG. 1 is a highly schematic diagram of a current loop stretcher as is known in the prior art.

Turning first to FIG. 1, there is shown a highly schematic diagram of a top plane view of a current loop stretcher as is known in the prior art. The stretcher includes a single hairpin loop 10 formed of a conductor on a single layer in a magnetic bubble domain device. The bubble propagation path in the thin magnetic layer typically lying underneath the conductor layer, and separated therefrom by a dielectric spacer, is shown schematically by the element 11, which in the present embodiment is an ion-implanted contiguous disk pattern. The element 12 schematically indicates a magnetoresistive detector in the device.

Figure 2:
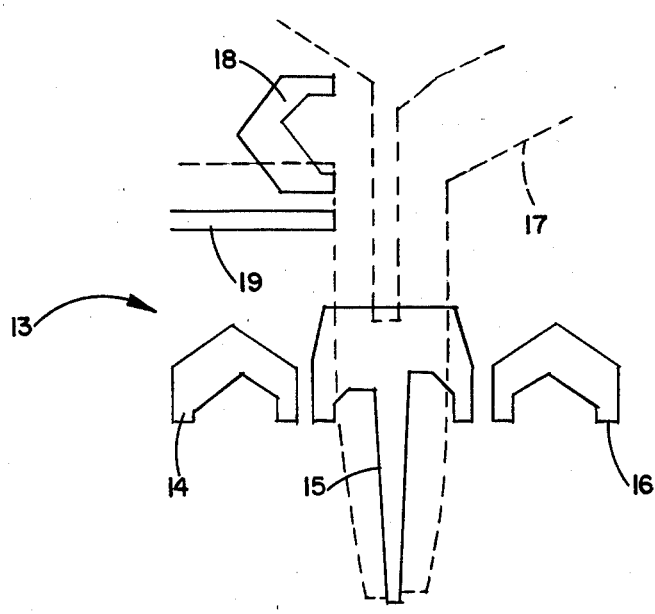
FIG. 2 is a diagram of the combination of a current loop stretcher with a pickaxe configuration as is known in the prior art.

Turning next to FIG. 2, there is shown a configuration as is known in the prior art. Such a configuration is based upon the pickax replicator used in conventional permalloy field access devices.

The present invention provides considerable reduction in the stretcher power dissipation. The idea is that by replicating the bubble into several replicas, then simultaneously stretching them, one can achieve a larger total strip length, hence higher signal; or shorter stretching period; and hence, lower average power dissipation.

In quantitative terms, given the required bubble signal "S" in volts and frequency of operation f, in cycles per second, the power average dissipation is given by:

$$P = K(S^2 \cdot f)/(n) \text{ Watts}$$

where n is the number of bubble replicas and K is a fixed constant depending only on the particular stretcher design (linewidth, conductor thickness, etc.), the conductor specific resistance, bubble mobility, garnet magnetization, etc.

It is thus apparent that by using a number of replicators, the frequency of operation or the detector signal can be increased several times without increasing the stretcher average power dissipation.

We turn first to a particular replicator design according to the present invention for use in ion-implanted devices. The design utilizes the thin permalloy layer, used in the sensor element, in a stretch-and-cut type replicator. This type of replicator is used extensively in conventional permalloy devices. A very familiar replicator known in the prior art as the pickax. In that replicator, the bubble is stretched over the broad face of the pickax by virtue of the strong pole distribution induced by the in-plane field, and a current pulse is applied to the hair-pin conductor loop at the appropriate time to cut the bubble into two parts. One bubble proceeds in the primary track as would the original bubble, and the second part is transferred to a secondary track under the combined influence of the current in the hair-pin conductor and field due to the permalloy elements of the switch.

Figure 3A:
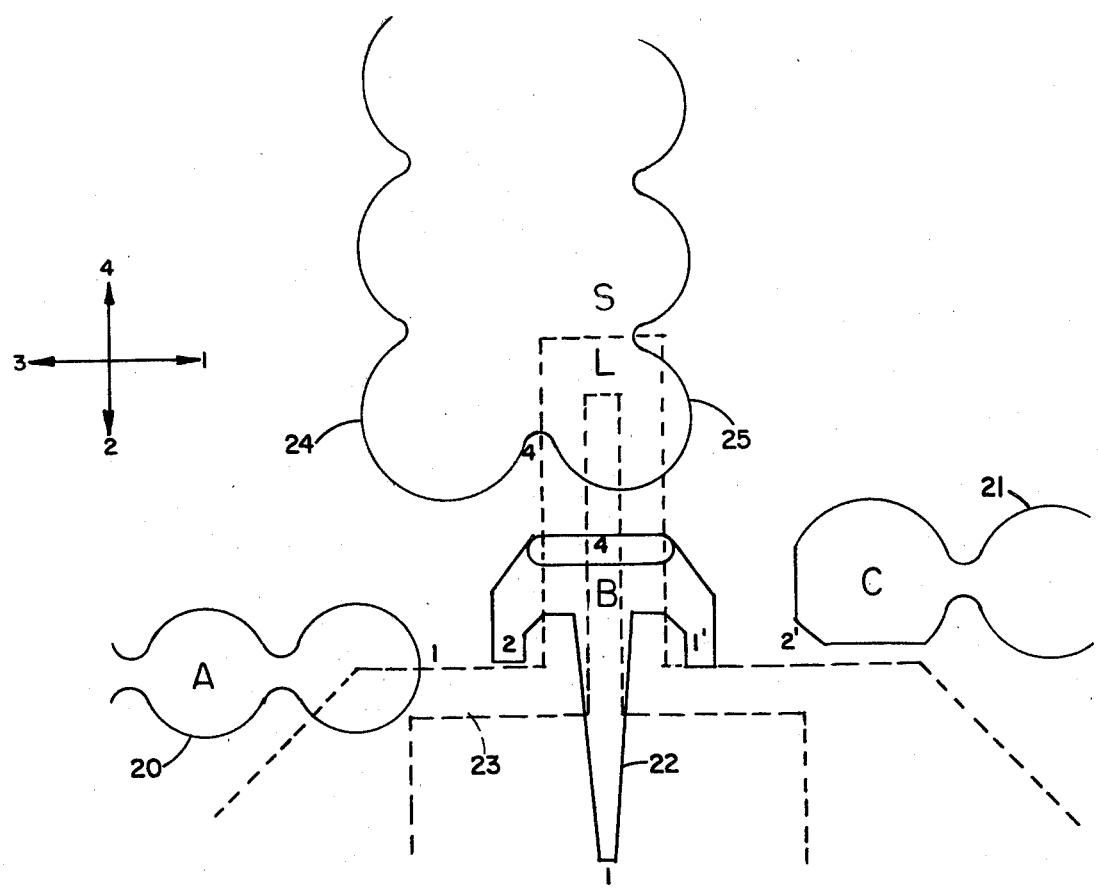
FIG. 3a is a first embodiment of a bubble replicator according to the present invention.

The replication concept according to the present invention is embodied in an ion-implanted circuit as shown in FIG. 3a. The permalloy element is located between two ion-implanted tracks which constitute part of the primary track. With no replication required, the bubbles are transferred from track A to the pickaxe element B and from there to track C under the influence of the current in conductor L.

Figure 3B:
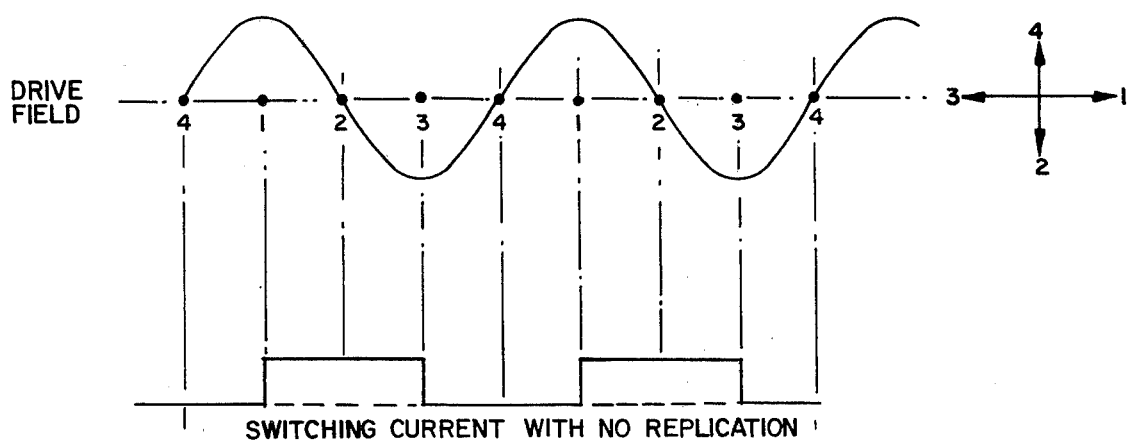

A timing diagram showing the current wave form and phase relationship to the rotating field is presented in FIG. 3b. Turning now to the operation of the device, a bubble propagating in track A reaches point "1" when a current in conductor L is applied. The bubble is blocked from propagating around the disk by the field generated by the current, so the bubble transfers to point 2 on the pickaxe element at about phase "3". The bubble propagates around and the top of the pickaxe element until point 1' where the current is reapplied and the bubbles transfer to point 2' on track C at about a phase between "2" and "3".

Figure 3C:
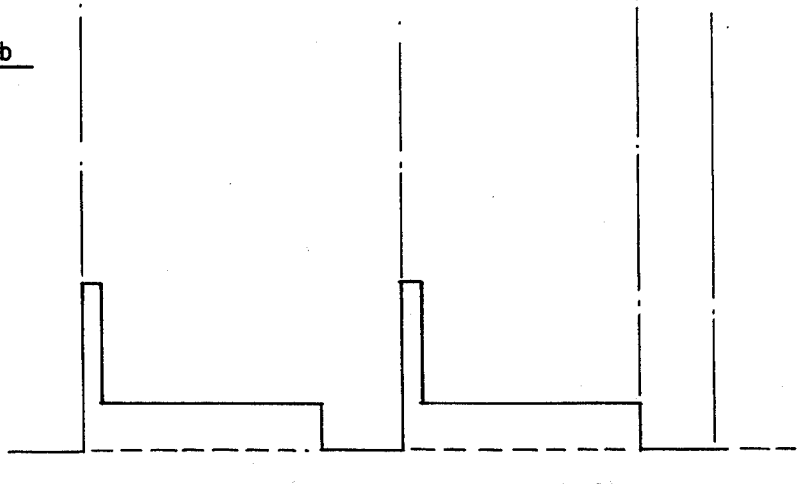

When replication is desired, a sharp current pulse is applied as the bubble reaches point 4, causing the bubble to split it into two parts. One bubble transfers to cusp 4' on the secondary track S, and the second bubble proceeds to point 1' and is transferred from there to track C. The timing diagram replication sequence is shown in FIG. 3c.

Figure 4:
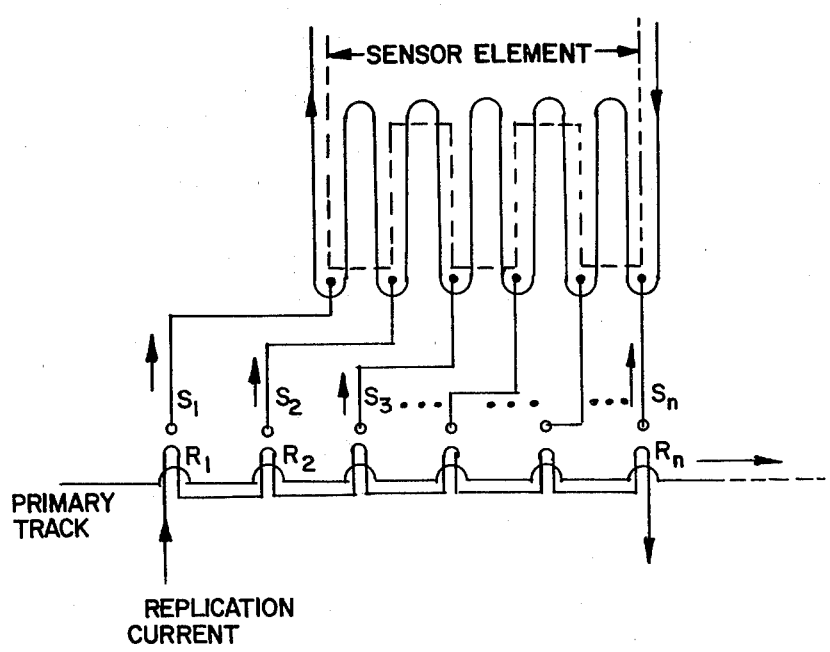
FIG. 4 is a schematic diagram of the segmented stretcher detectors of the present invention together with a sensor element.

An implementation of the detection scheme according to the present invention using a plurality of replicators and segmented stretcher detector is shown in FIG. 4. A number of replicators $R_1$, $R_2$, $R_n$ are located on the major loop of the bubble domain device. Their separation could be several bits apart, e.g. 4 bits.

The bubbles propagate along a secondary track from each replicator to the segmented detector. The length of the tracks (as measured in bits) are selected so that the replicas from the same bubble arrive at the stretcher loops at the same time. The sensor elements in the segmented detector are connected in series to add their individual signals.

The replicators $R_1$, $R_2$ are connected in series and are activated simultaneously every cycle for consecutive bit detection.

While the invention has been illustrated and described as embodied in a segmented stretcher detector, it is not intended to be limited to the details shown, since various modifications and structural changes may be made without departing in any way from the spirit of the present invention.

It will be obvious to those skilled in the art that the magnetic bubble device according to the present invention can be manufactured with various lithographic technologies and different combinations of known process steps, and that the preferred embodiments illustrated here are merely exemplary. The configuration and distance between the guide elements, as well as their distance to the magnetic bubble layer, can be chosen depending upon the desired properties. These and other variations can be further elaborated by those skilled in the art without departing from the scope of the present invention.

The present invention is also not restricted to the specific magnetic materials and circuits described. For example, it may be pointed out that magnetic materials other than garnet, for example hexagonal ferrites or various crystalline compounds may be used. Moreover the source, orientation, and frequency of the magnetic field, and the state or dynamic nature of the signals applied to the device may be suitably selected as desired for a particular application.

Without further analysis, the foregoing will so fully reveal the gist of the present invention that others can, by applying current knowledge readily adapt it for various applications without omitting features that, from the standpoint of prior art, fairly constitutes essential characteristics of the generic or specific aspects of this invention, and, therefore, such adaptations should and are intended to be comprehended within the meaning and range of equivalance of the following claims.

I claim:

1. A magnetic bubble domain device comprising:
    an ion implanted propagation path for magnetic bubble domains comprising first and second spaced apart portions;
    first replication means disposed adjacent said propagation path comprising a hairpin loop intersecting said propagation path at a substantially right angle and functioning to replicate one of said propagating bubble domain into a pair of magnetic bubble domains and to transfer one of said bubble domains to a first ion implanted secondary track extending in a direction different from said direction of said propagation path;
    a permalloy element disposed between first and second portions of said ion implanted propagation path, said permalloy element comprising a pickaxe element, and
    functioning to transfer one of said bubble domains into one of said portions of said ion implanted track; and
    detection means functioning to detect said magnetic bubble domains.

2. A device as defined in claim 1, wherein said detection means comprises a magnetoresistive sensor element extending along said secondary tracks.

3. A device as defined in claim 1, further comprising pulse means for providing a signal pulse to said hairpin loop at a first predetermined time.

4. A device as defined in claim 1, further comprising means coupled to said device for generating and controllably positioning magnetic bubble domains on said propagation path.

* * * * *